219-121 SR
6/23/81      OR    4,275,288

United States Patent [19]
Makosch et al.

[11] 4,275,288
[45] Jun. 23, 1981

[54] APPARATUS FOR MACHINING MATERIAL

[75] Inventors: Günter Makosch, Sindelfingen; Franz Schedewie; Arno Schmackpfeffer, both of Böblingen; Jörg Ziller, Sindelfingen, all of Fed. Rep. of Germany

[73] Assignee: International Business Machines Corporation, Armonk, N.Y.

[21] Appl. No.: 25,414

[22] Filed: Mar. 30, 1979

[30] Foreign Application Priority Data

May 19, 1978 [DE] Fed. Rep. of Germany ....... 2821883

[51] Int. Cl.³ ............................................. B23K 27/00
[52] U.S. Cl. ...................... 219/121 LR; 219/121 LC; 219/121 LK
[58] Field of Search .................. 219/121 LR, 121 LP, 219/121 LC, 121 LD, 121 LK, 121 LL; 350/8, 160 R

[56] References Cited
U.S. PATENT DOCUMENTS

| | | | |
|---|---|---|---|
| 3,419,321 | 12/1968 | Barber et al. | 219/121 LR X |
| 3,705,758 | 12/1972 | Haskal | 350/160 R |

FOREIGN PATENT DOCUMENTS

| | | |
|---|---|---|
| 2012718 | 9/1971 | Fed. Rep. of Germany . |
| 2446962 | 8/1976 | Fed. Rep. of Germany . |

OTHER PUBLICATIONS

J. L. Mauer, et al., *IBM Journal of Research and Development*, "Electron Optics of an Electron-Beam Lithographic System," vol. 21, pp. 514–521, Nov. 1977.

K. H. Drake, et al., *Loten and Schweissen in der Elektronik*, "Contacting of Semiconductor Components by Laser Beams with not-Gauss-form Distribution of Intensity", DVS-Berichte 40, 1976, Werner-Verlag GmbH, Dusseldorf.

*Primary Examiner*—C. L. Albritton

[57] ABSTRACT

The gaussian energy distribution common to all laser beams is a serious handicap in most laser beam applications for machining material, such as for drilling, welding and the like. This is especially true in welding extremely thin metal sheets, as in the manufacture and assembly of the transducers of modern magnetic disk files. According to the subject invention, a laser beam is directed to a glass cone or axicon which converts the gaussian energy distribution of the laser beam to one more uniform in cross-section. Depending on the distance of the workpiece from the exit side of the axicon, the energy distribution of the radiation impinging onto the workpiece will be either uniform, saddle shaped or annular cross-section. It has been discovered that saddle shaped or annular energy distributions are optimal for welding very thin metal sheets by a laser beam since the heat dissipation in the center of a welding spot is a minimum and that at the periphery of the laser beam depends on the material, size and shape of the workpiece, which parameters can be matched by adjusting the distance between the axicon and the workpiece.

1 Claim, 4 Drawing Figures

APPARATUS FOR MACHINING MATERIAL

The invention relates to apparatus for machining material by means of laser or electron and like radiant energy beams, particularly for drilling, welding or punching holes in the material.

In many technical fields, particularly in precision engineering work, the use of laser and electron beams for drilling, welding or punching operations is becoming increasingly important. Experience shows that the intensity of the beam energy applied to the workpiece must be controlled with high precision since, particularly in the machining of a very small or thin workpiece, there can be considerable disturbance. In the spot welding of very thin sheets, for example, holes may appear instead of, or within, the welded joint should the energy requirement of the beam be exceeded only slightly, but should the beam energy be too low the resulting welded joint again is unsatisfactory.

In drilling and punching processes with laser and electron beams, the beam energy for the adequate execution of each process must be observed very closely, too, for obtaining holes with the desired diameters and wall surface characteristics, for if the energy of the beam used is too low the drilling process wastes time, or the drilled holes lack the required form so that the process is not economical. If, on the other hand, the beam energy is too high the areas to be removed do not change into the fluid state, as required for drilling perfect holes, but explode directly into the gaseous state, in which event the material ejected may damage the hole walls, or mar the material surrounding the drilled hole.

Because the energy distribution in practically all laser and electron beams is in the form of a gaussian curve, it is quite evident that it will generally not be possible to obtain the optimum energy density over the entire cross-section of the beam, with the consequence that the theoretically possible high quality of drilled holes and welded joints is practically inachievable. If it is further considered that the heat transported radially is lowest in the center of a drilled hole or welded joint and highest in the periphery, it is quite obvious that the practically invariable temperature distributions in the workpiece are still no more favorable than the energy density distribution in prior art processing beams. The disadvantages caused by the above mentioned factors are only partly avoided by technically complicated and time-consuming measures, as complex heat transport means and the use of pulsed lasers. In German Offenlegungsschrift No. 24 46 962 it has been suggested that annular energy distributions be obtained by means of diaphragms in the central area of the laser beam, thus avoiding part of the above mentioned disadvantages. Apart from the high energy load on these diaphragms and the difficulty of adjusting them, these devices only produce specific energy distributions which represent limits which are insufficient, or at least not optimal, for many uses. It has been suggested further, e.g. in the publication "Kontaktieren von Halbleiterbauelementen mit Laserstrahlen mit nichgaubformiger Intensitatsverteilung" by K. H. Drake et al, DVS-Berichte 40 (1976), Loten and Schweissen in (der Elektronik), Werner-Verlag GmbH, Dusseldorf, that energy density distributions with so-called "saddle" profiles which permit a better heat distribution in the workpieces to be machines be produced by specific means in the laser cavity, e.g. by using mode diaphragms. The technical apparatus required, however, is so large and the use of such a specific device is restricted to such a narrow scope of material properties, material thickness and hole or joint diameters that the use of such apparatus is practical only in a few applications.

It is an object of the invention to provide laser beam machining apparatus providing optimum temperature distribution in a simple manner and without any energy loss for the respective purpose, under a great variety of marginal conditions.

The prior art apparatus of the above specified type had to be for the respective marginal conditions and requirements for drilling or welding jobs, for each material, for each workpiece thickness, as well as for each size of hole or welded joint, and in many cases even had to be built for the specific purpose as a general rule. Nevertheless, the temperature distributions optimal for each specific case could only be approximated, and in most of the cases only roughly approximated. Apart from a relatively high amount of apparatus and time involved, very high demands were made on the operating staff, particularly when changes to new fields of use occurred. In addition thereto, the quality of the results obtained was generally much lower than would have been possible had there been an ideal temperature distribution in the workpiece. By means of the present invention, on the other hand, it is possible to ensure optimum energy distributions required for the respective materials, workpiece thicknesses, drilled hole or welded joint diameters in a simple manner, e.g. by shifting one or several optical elements of the apparatus along the optical axis in the beam path. Suitable calibrated scales are provided at the elements to be shifted, whereby the device according to the invention is adjusted even by untrained personnel to jobs having a great variety of marginal conditions, whereas with the prior art apparatus of the above specified type it is necessary, when changing from one mode of operation to another one, or upon an essential change of the marginal conditions, to carry out extensive redesign and complicated resetting.

The invention is described below with reference to the accompanying drawing forming a part of the specification and in which.

Figure 1:
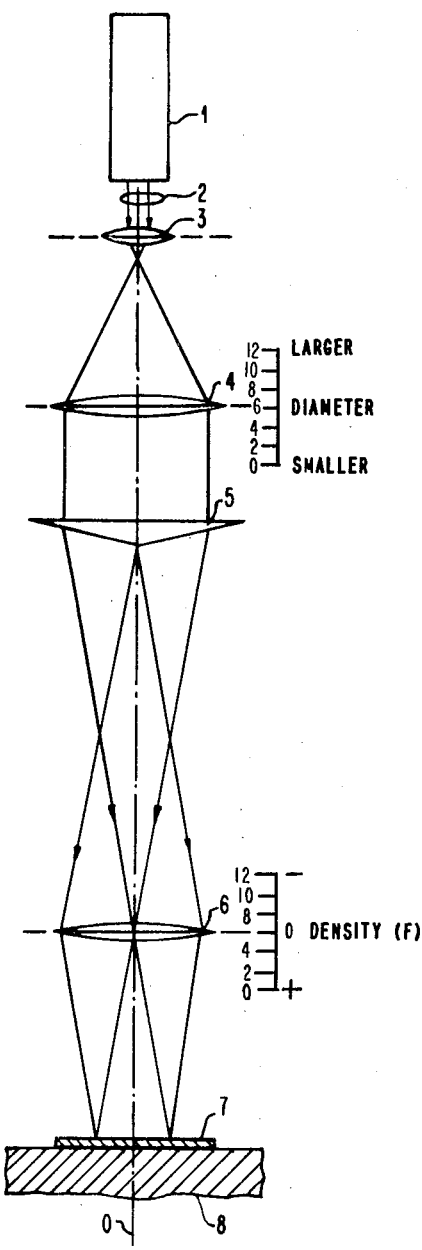
FIG. 1 is a schematic diagram of an embodiment according to the invention.
Figure 4:
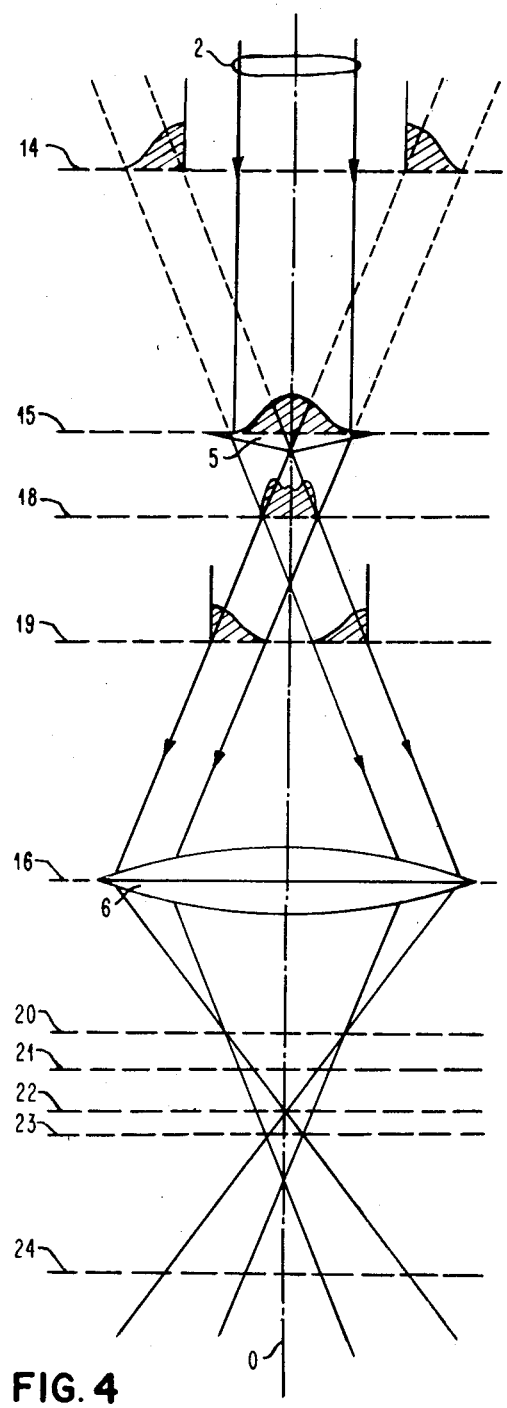
FIG. 4 is a schematic representation of the beam path in the embodiment of the invention as shown in FIG. 1, and the relative energy distributions in the laser beam that appear in different planes.
Figure 2:
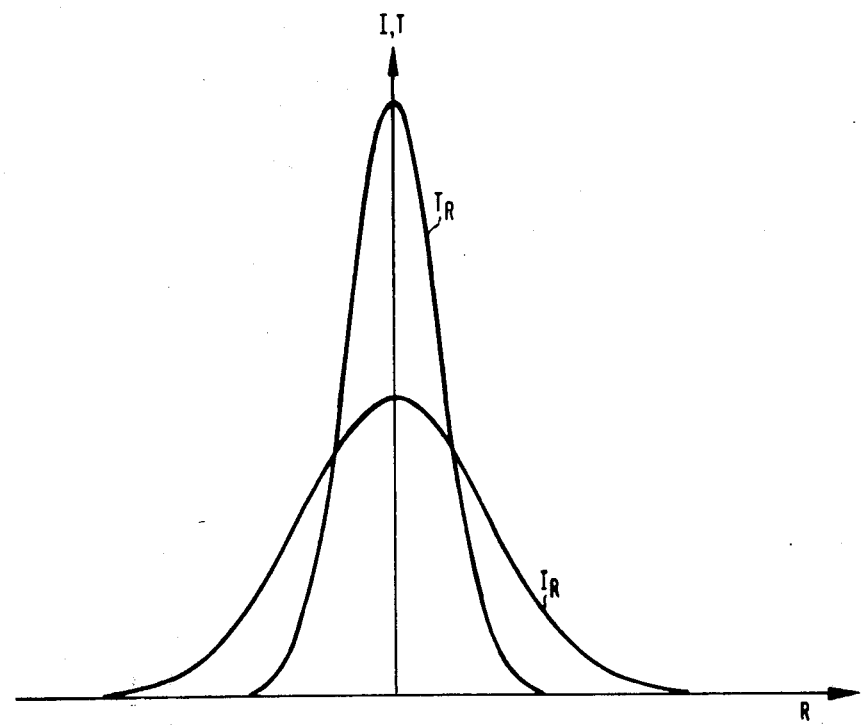
FIG. 2 is a graphical representation of the temperature distribution in a workpiece on which a laser beam impinges showing a gaussian energy distribution.
Figure 3:
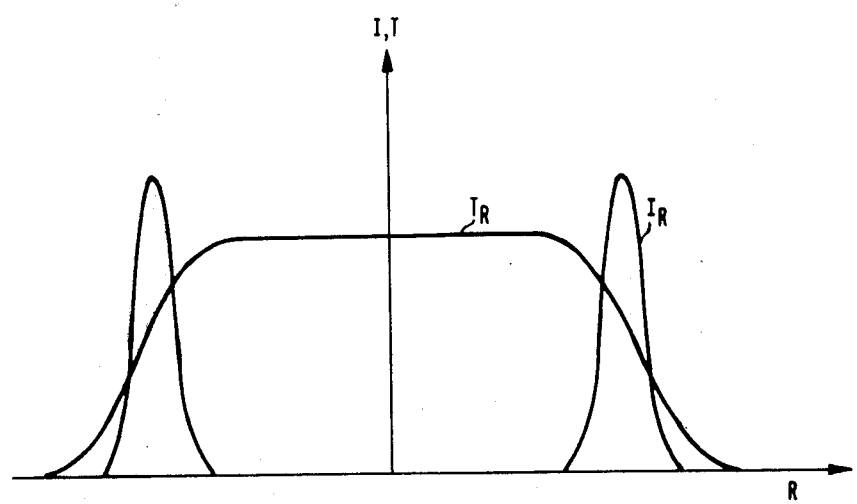
FIG. 3 is a graphical representation of the temperature distribution in a workpiece when processed with apparatus according to the invention, and particularly the embodiment shown in FIG. 1.

The embodiment of the invention as shown in FIG. 1, comprises a light source 1, for example a laser, lenses 3 and 4 arranged for expanding the beam cross-section, and axicon or cone 5 made of transparent light refracting material, for example glass or quartz, and of a lens 6 for focusing the energy distribution caused by cone 5 on the surface of a workpiece 7 to be processed which is arranged on an X-Y table 8. The cross-section of the beam 2 emanating from the laser is expanded by the arrangement of the lenses 3 and 4. Subsequently, the beam impinges onto the plane surface of the solid revolution forming the cone 5. When exiting from the conical surface of the cone 5 the beam is diffracted to form a hollow cone of light having a wall thickness equalling half of the diameter of the beam entering the cone 5. A sectional view of this hollow cone of light is shown in the central part of FIG. 4. The intensity distribution of the annular radiation zone formed on the surface of the workpiece 7 is shown by the curve $I_R$ in FIG. 3. If a beam having this energy distribution is directed onto a workpiece the high heat transport in the marginal zone in radial direction and the heat accumulation in the central zone produce the temperature distribution represented by the curve $T_R$. However, if a workpiece is impinged upon by a laser beam showing the standard gaussian energy distribution there is a temperature distribution, due to the high heat transport in the marginal peripheral zones in the radial direction and the heat accumulation in the central area, which corresponds to a much steeper gaussian curve. In FIG. 2, the curve $I_R$ represents the standard energy distribution of a laser beam as a function of the distance from the central axis of the beam, and the curve $T_R$ represents the heat or temperature distribution. It is obvious that with the curve $T_R$ of the temperature distribution as shown in FIG. 2, only substantially point-sized joints can be welded, and approximately cylindrical holes can only be drilled if the marginal conditions are strictly observed. On the other hand, with the curve $T_R$ of the heat distribution shown in FIG. 3, relatively large joints can be welded without particularly high demands being made on maintaining the energy applied by the laser beam.

In planes 15, 18 and 19 the shaded areas represent the energy distributions which are generated. In planes 22, 23 and 24 the energy distributions associated with the energy distributions in planes 15, 18 and 19 are shown at a reduced scale. The energy distribution of plane 14 is used for generating the energy distribution appearing in plane 21. The energy distribution appearing in FIG. 1 on the surface of workpiece 7 is shown in the beam path of FIG. 4 in plane 20.

By shifting the workpiece 7 in the direction of the optical axis 0 the energy distribution of the laser beam is altered within a wide range. Further variations are achieved through a relative movement between the cone 5 and the lens 6.

While a dioptric or refracting type of axicon 5 is shown, it is contemplated that a catoptric or reflecting device will be used where the apparatus is arranged for that type of element.

While the invention has been described in terms of an express embodiment, and alternatives have been suggested, it is clearly to be understood that those skilled in the art will effect further changes without departing from the spirit and scope of the invention as defined in the appended claims.

The invention claimed is:

1. Apparatus for machining material as by drilling, punching and welding by means of a radiant energy beam of gaussian profile at the workpiece,
    characterized by
    an optical converting element arranged in the path of the processing beam, for the axis-symmetrical conversion of the paraxial and of the off-axis cross-sectional areas of the processing beam to a substantially uniform temperature gradient across the workpiece by
    a focusing element arranged beyond it in the direction of beam propogation, by
    said converting element and said focusing element selectively being arranged to be shifted selectively in the direction of the optical axis relatively to each other for adjusting the respective energy density distribution and the beam diameter, and by
    said converting element and said focusing element selectively being associated with calibrated scales giving the relative diameter and the relative energy density distribution of the generated processing beam directly.

* * * * *